United States Patent
Lischner et al.

[19]

[11] Patent Number: 6,118,177
[45] Date of Patent: Sep. 12, 2000

[54] HEATSPREADER FOR A FLIP CHIP DEVICE, AND METHOD FOR CONNECTING THE HEATSPREADER

[75] Inventors: David Lischner, Allentown; Raymond J. Nika, Whitehall; James Robert Ronemus, Lehighton, all of Pa.

[73] Assignee: Lucent Technologies, Inc., Murray Hill, N.J.

[21] Appl. No.: 09/193,832

[22] Filed: Nov. 17, 1998

[51] Int. Cl.[7] .......................... H01L 23/10; H01L 23/34; H01L 23/12

[52] U.S. Cl. .......................... 257/706; 257/704; 257/783; 257/710; 257/712

[58] Field of Search ...................... 257/706, 675, 257/778, 704, 783, 710, 678, 712–714, 717, 721; 361/687–690, 702

[56] References Cited

U.S. PATENT DOCUMENTS

| | | |
|---|---|---|
| 4,561,040 | 12/1985 | Eastman et al. . |
| 5,151,388 | 9/1992 | Bakhit et al. . |
| 5,289,337 | 2/1994 | Aghazadeh et al. . |
| 5,329,160 | 7/1994 | Miura et al. ........................ 257/714 |
| 5,345,107 | 9/1994 | Daikoku et al. .................... 257/717 |
| 5,497,027 | 3/1996 | Crafts . |
| 5,521,406 | 5/1996 | Tserng et al. . |
| 5,610,442 | 3/1997 | Schneider et al. . |
| 5,621,615 | 4/1997 | Dawson et al. . |
| 5,650,918 | 7/1997 | Suzuki .............................. 257/704 |
| 5,723,369 | 3/1998 | Barber . |
| 5,736,785 | 4/1998 | Chiang et al. . |
| 5,744,863 | 4/1998 | Culnane et al. . |
| 5,744,869 | 4/1998 | Root . |
| 5,757,081 | 5/1998 | Chang et al. . |
| 5,767,578 | 6/1998 | Chang et al. . |
| 5,785,799 | 7/1998 | Culnane et al. . |
| 5,789,810 | 8/1998 | Gross et al. ....................... 257/704 |
| 5,801,072 | 9/1998 | Barber . |

FOREIGN PATENT DOCUMENTS

| | | | |
|---|---|---|---|
| 1-117049 | 5/1989 | Japan ............................ 257/712 |
| 1-199439 | 8/1989 | Japan ............................ 257/710 |
| 2-28351 | 1/1990 | Japan ............................ 257/704 |
| 4-87354 | 3/1992 | Japan ............................ 257/710 |

OTHER PUBLICATIONS

"Aluminum Nitride Cap Design Obviating Problems of Thermal Conductivity and TEC Associated with Polymer–Ceramic Substrare." IBM Technical Disclosure Bulletin. vol. 34 No. 7B, pp 341–342 Class /sab 257/704, Dec. 1991.

*Primary Examiner*—David Hardy
*Assistant Examiner*—Jhihan B Clark
*Attorney, Agent, or Firm*—Duane Morris & Hecksher, LLP; Steven E. Koffs

[57] ABSTRACT

A circuit board assembly includes an integrated circuit package. A first substrate has first and second surfaces. Each surface of the first substrate has a plurality of terminal pads. An integrated circuit device has first and second faces. The first face has a plurality of electrical interconnections to the terminal pads in the first surface of the first substrate. A heatspreader plate has a plurality of legs. For example, the heatspreader may be shaped like a table with four legs. The heatspreader may be formed of copper. The second face of the integrated circuit device is connected to the heatspreader plate by a first thermal interface material. Each of the plurality of legs is connected to the first surface of the first substrate by a second thermal interface material. The first and second thermal interface materials may both be, for example, a conductive silver-filled epoxy. The heatspreader provides an open package that is easily cleaned and drained. A second substrate (which may be a motherboard, system board, or other printed circuit board) has a plurality of terminal pads. The terminal pads of the second substrate are connected to the terminal pads of the second surface of the first substrate. In an alternative (direct chip attach) configuration, the flip chip device and the heatspreader may be directly connected to a printed circuit board, which may be a motherboard or other system board.

19 Claims, 4 Drawing Sheets

100

200

HEATSPREADER FOR A FLIP CHIP DEVICE, AND METHOD FOR CONNECTING THE HEATSPREADER

FIELD OF THE INVENTION

The present invention relates to semiconductor devices generally, and more specifically to packages and packaging methods for flip chip devices.

DESCRIPTION OF THE RELATED ART

Flip chip technology provides a method for connecting an integrated circuit (IC) device to a substrate within a package. In the flip chip method, a plurality of electrical terminals are formed on an active face of the IC device. A respective solder bump is formed on each of the electrical terminals. The substrate has a plurality of terminal pads corresponding to the terminals on the IC device. The IC device is "flipped," so that the terminals of the device contact the pads of the substrate. Heat is applied to reflow the solder bumps, forming electrical and mechanical connections between the substrate and the active face of the IC device.

The flip chip package is very compact, and is also referred to a chip-scale package. The flip chip device poses design challenges, because a thermal mismatch between the IC device and the substrate may cause a delamination failure. One method of reducing this problem is to place a heat spreader on the back (non-active) side of the IC device.

In U.S. Pat. No. 5,289,337 to Aghazadeh et al., FIG. 6 shows a heat spreader 26' for shunting heat to the substrate 3. The heatspreader plate is held in position by an attachment ring 24'. The heatspreader plate 26' contacts the substrate 3 through a layer of thermal grease 7. The entire package is hermetically sealed in a ceramic package having a plurality of leads. The package is installed in a printed circuit board (PCB), using the package leads. U.S. Pat. No. 5,289,337 is incorporated by reference herein in its entirety.

New thermal control configurations are desired for flip chip technology.

SUMMARY OF THE INVENTION

The present invention is a flip chip device having a heatspreader, wherein the heatspreader has a face, to which an inactive surface of the device is connected, and a plurality of legs which are connected to a substrate.

According to one aspect of the invention, a circuit board assembly, includes a substrate having a plurality of terminal pads. An IC device has a first and a second face. The first face of the device has a plurality of electrical interconnections to the terminal pads in the substrate. A heatspreader plate has a plurality of legs. The second face of the IC device is connected to the heatspreader plate by a first thermal interface material. Each of the plurality of legs is connected to the substrate by a second thermal interface material.

According to a second aspect of the invention, a method is provided for connecting a heatspreader to an IC device that is connected to a substrate in a flip-chip configuration. A first thermal interface material is used to connect a heatspreader plate to a non-active side of the IC device. The heatspreader plate has a plurality of legs. A second thermal interface material is used to connect each of the plurality of legs to the substrate.

DETAILED DESCRIPTION

Figure 1:
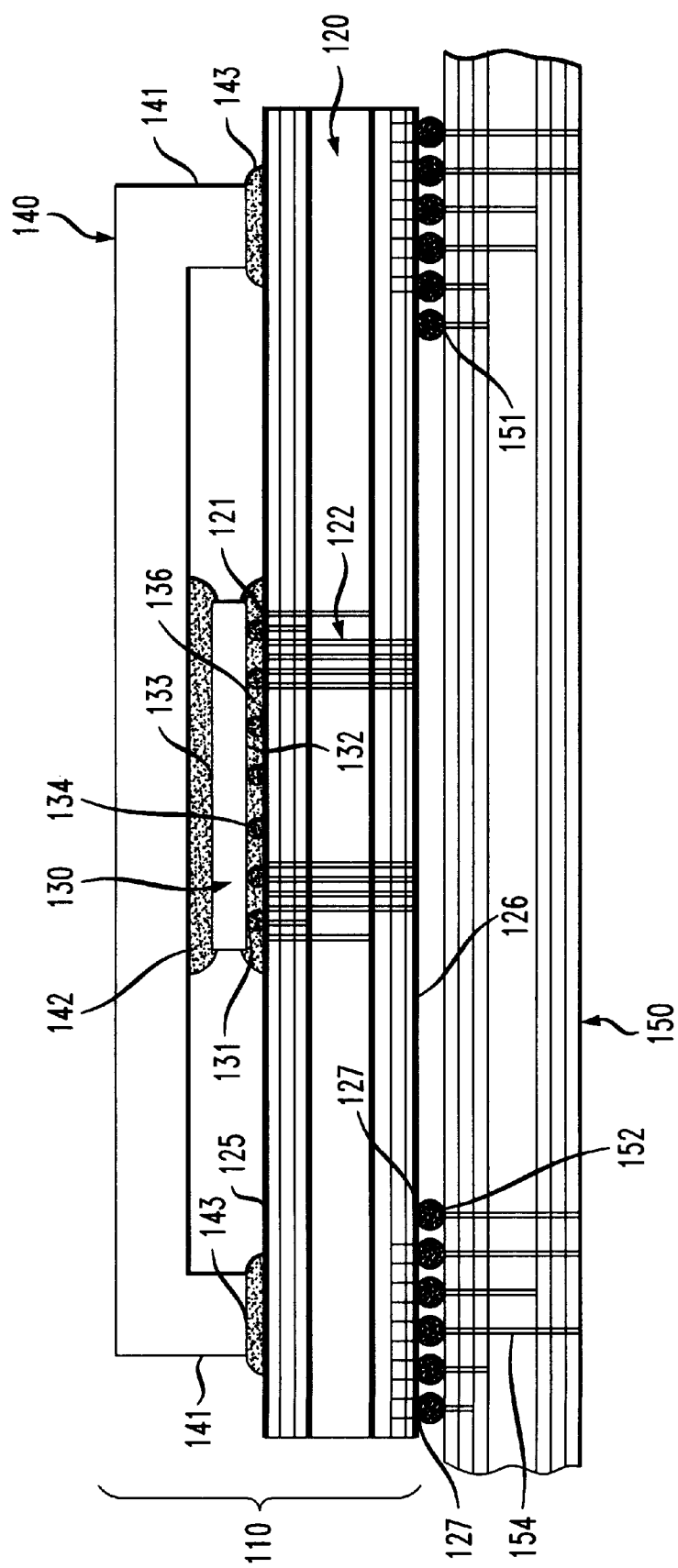
FIG. 1 is a cross sectional view of a circuit board assembly having an IC package according to the present invention.
Figure 2:
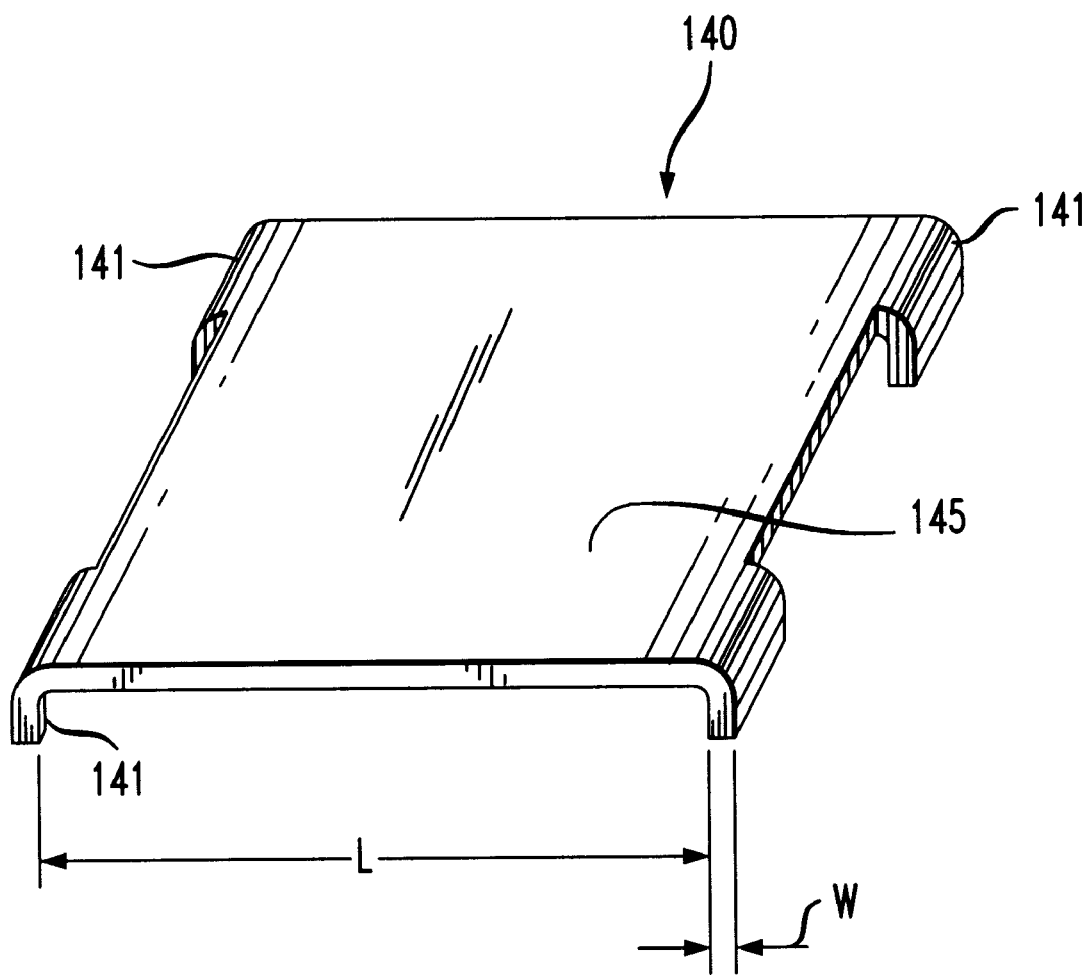
FIG. 2 is an isometric view of the heat spreader shown in FIG. 1.

FIGS. 1 and 2 show an exemplary circuit board assembly 100 according to the invention, in which a flip chip IC package 110 is connected to a PCB 150, which may be a motherboard or other PCB.

The flip chip IC package has a first substrate 120. The first substrate 120 has a first surface 125 and a second surface 126. Surface 125 has a plurality of terminal pads 121, and surface 126 has a plurality of terminal pads 127. In the example, the first substrate 120 is an organic substrate, such as a glass/epoxy substrate. The substrate may have a plurality of levels, with electrical paths between layers provided by interconnect vias 122, as shown.

An IC device 130 has a first (active) face 132 and a second (non-active) face 133. The first (active) face 132 has a plurality of electrical interconnections 134 to the terminal pads 121 of the first surface 125 of the first substrate 120. In the example, the electrical interconnections 134 are formed by solder bumps which are reflowed to form an electrical and mechanical bond between the IC device 130 and the first substrate 120. The chips get flipped on top of the substrate using, for example the C4 process developed by IBM, or another solder ball process. Alternatively, organic connections may be used instead of solder bumps for this interconnection.

A conventional underfill 136 is applied to fill the space between the IC device 130 and the first face 125 of the first substrate 120. The underfill 136 protects the electrical interconnections 136 from mechanical stresses during thermal cycling. The underfill material may be an epoxy or other known underfill material.

A heatspreader 140 has a plate section 145 and a plurality of legs 141. The second face 133 of the IC device 130 is connected to the heatspreader plate 145 by a first thermal interface material 142. Each of the plurality of legs 141 is connected to the first surface 125 of the first substrate 120 by a second thermal interface material 143.

The heatspreader plate 140 is best seen in FIG. 2. FIG. 2 is not a scale drawing. Each leg 141 has a respective width W. A shortest distance L between any two of the plurality of legs 141 is substantially greater than the greatest width among the plurality of legs. The general shape of the heatspreader 140 is that of a table. As a result, the volume between heatspreader 140 and the first substrate 120 is open, and may be easily flushed with a solvent (such as water) for cleaning. Rather than using a hermetic, quasihermetic or pinhole-free seal for the package 110, the package remains open and is easily cleaned. Any cleaning fluid that is used is easily drained out of the package. The length of the legs may be, for example, 0.05 centimeters (20 mils).

In the example, the heatspreader is formed of copper. Copper is advantageous because it has high thermal conductivity. Other materials having a high thermal conductivity and compatible coefficient of thermal expansion may also be used. A material with a substantially different coefficient of thermal expansion (such as aluminum) may be used for the heatspreader, but the thermal interface materials would have to be elastic to accommodate the expansion of the heatspreader, and still conduct heat well.

Although the legs 141 shown in FIG. 2 have a rectangular cross-section, the legs may have any cross section, such as elliptical, circular, or angle-shaped ("L" shaped). A rectangular cross section is advantageous, because it allows the heatspreader 140 to be fabricated from a single flat piece of metal. For example, the heatspreader plate 145 and legs 141 may be stamped and the legs bent into position in a single step. Alternatively, the piece of material may be cut out first, and the legs bent into position separately. Other conventional fabrication techniques, including, but not limited to, molding or milling may also be used. Further, the legs 141 may be formed from separate pieces of material, and joined to the heatspreader plate 145 by conventional techniques, such as soldering, brazing, welding, or using adhesives.

The heatspreader 140 shown in FIG. 2 has four legs 141, which is suitable for a relatively small heatspreader having an aspect ratio relatively close to one. Different numbers of legs may be used. A large heat spreader, or a heatspreader having a high aspect ratio, may have more than four legs, for example, six or eight legs. A very small heatspreader 140 may have two angle shaped legs (not shown) at opposite comers along a single diagonal of the heatspreader plate 145. Also, because the legs spread heat away from the device, it may be advantageous to use more than four legs if the IC device consumes a large amount of power.

The first and second thermal interface materials 142 and 143 may be, for example, selected from the group consisting of an adhesive, thermal grease, solder and a phase change material. The first and second thermal interface materials 142 and 143 may be the same material or different materials. Preferably, the second thermal interface material 143 is a thermally conductive adhesive. In the example, both the first and second thermal interface materials are a conductive adhesive, such as a silver-filled epoxy.

Although the example only includes a single IC device 130 connected to the heatspreader, one of ordinary skill in the art recognizes that a plurality of IC devices may be connected to a single heatspreader in a multi-chip module configuration. As noted above, more than four legs may be advantageous for spreading a large amount of power, and this may be the case when multiple devices are connected to a single heatspreader.

The flip chip package 10 is connected to the second substrate (PC board 150). PC board 150 has a plurality of terminal pads 151. The terminal pads 151 of the second substrate (PC board 150) are connected to the terminal pads 127 of the second surface 126 of the first substrate 120. In the example, a plurality of solder balls 152 are formed on the terminal pads 127 of the first substrate. The solder balls 152 are heated to reflow the solder and form the electrical and mechanical connection between the package 110 and the PC board 150.

Figure 3:
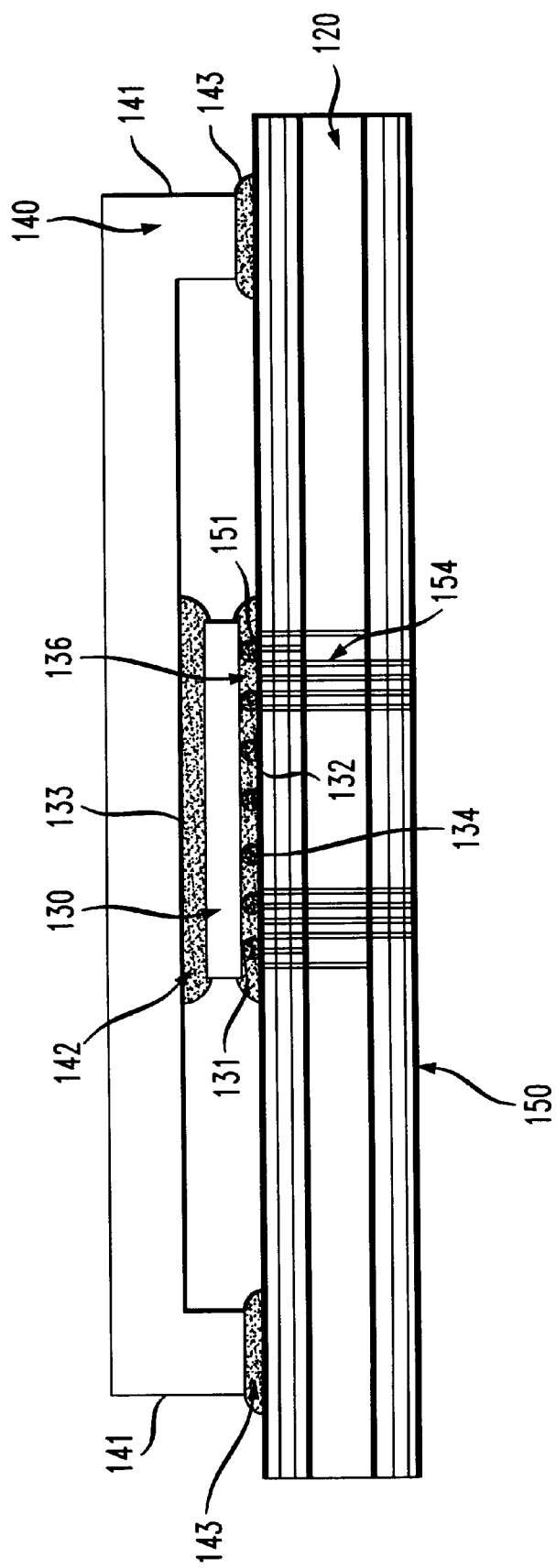
FIG. 3 is a cross sectional view of a circuit board assembly having an IC device directly attached to the circuit board using a method and structure according to the invention.

FIG. 3 shows an application of the invention to the direct chip attach process. In the assembly 200 of FIG. 3, the IC device 130 is directly attached to the PC board 150, without an intervening package substrate. Essentially, there is no package for the IC. The IC device 130, electrical terminals 131, first face 132, second face 133, solder bumps 134, underfill 136, heatspreader 140, legs 141, and thermal interface materials 142 and 143 may be the same as shown in FIG. 1, and descriptions of these items are not repeated. In a direct flip attach configuration, the heatspreader 140 provides physical protection and thermal control for the IC device 130.

From the foregoing, one of ordinary skill in the art recognizes a method of connecting a heatspreader to an integrated circuit device that is connected to a substrate in a flip-chip configuration.

A IC device 130 is attached to a substrate 120 (or 150) with a plurality of solder bumps 134. The device is placed on the substrate, and the solder bumps are reflowed to form electrical connections with terminal pads on the substrate, to form the flip-chip configuration. Other methods of forming the flip chip electrical interconnection may be substituted.

A heatspreader plate 145 and legs 141 are fabricated. The heatspreader plate 145 and legs 141 may be fabricated from a single flat sheet of metal. For example, the heatspreader 141 may be stamped from a single sheet of copper. A first thermal interface material 142 is used to connect the heatspreader plate 145 to a non-active side of the integrated circuit device. A second thermal interface material 143 is used to connect each of the plurality of legs 141 to the substrate 120 (or to the PC board 150).

Figure 4:
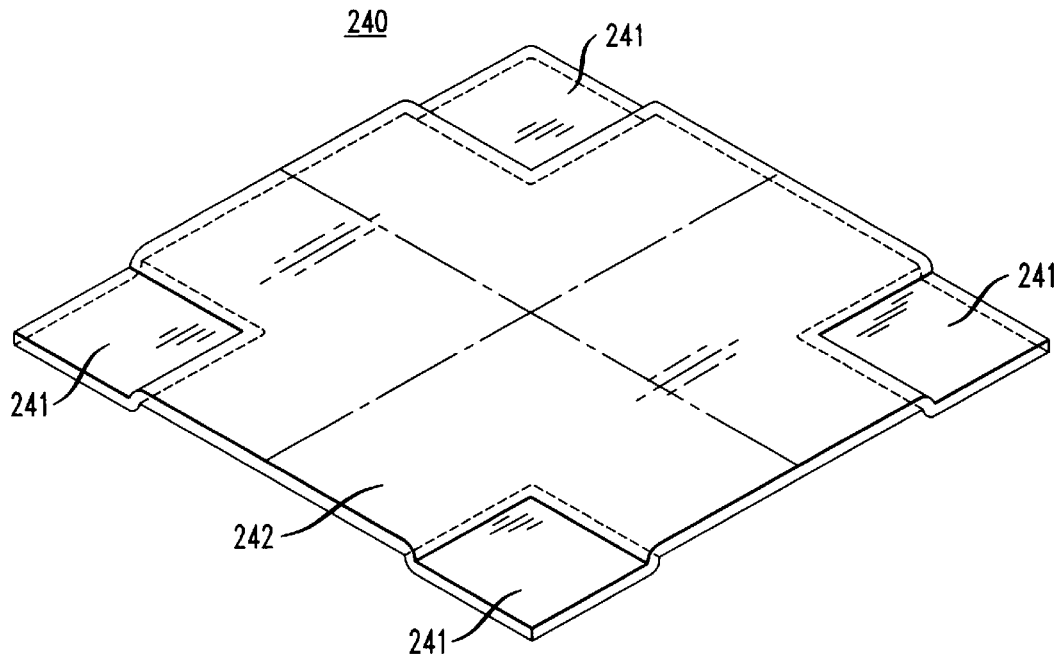
FIG. 4 is an isometric view of a second exemplary heatspreader according to the invention.

FIG. 4 is an isometric view of a second exemplary heatspreader 240 according to the invention. Heatspreader 240 has four legs 241 that are formed integrally with (for example, stamped into the same piece of material as) the heatspreader plate 242. Each leg has a bottom surface substantially parallel to the heatspreader plate section 242. The legs 241 may have a cross sectional area that is a substantial portion of the total area of the heatspreader 240. Heatspreader 240 provides a high heat efficiency relative to the amount of material used. The material may, for example, be copper. The heatspreader 240 of FIG. 4 is connected to the IC chip 130 and the substrate 120 in the same manner as described above.

Figure 5:
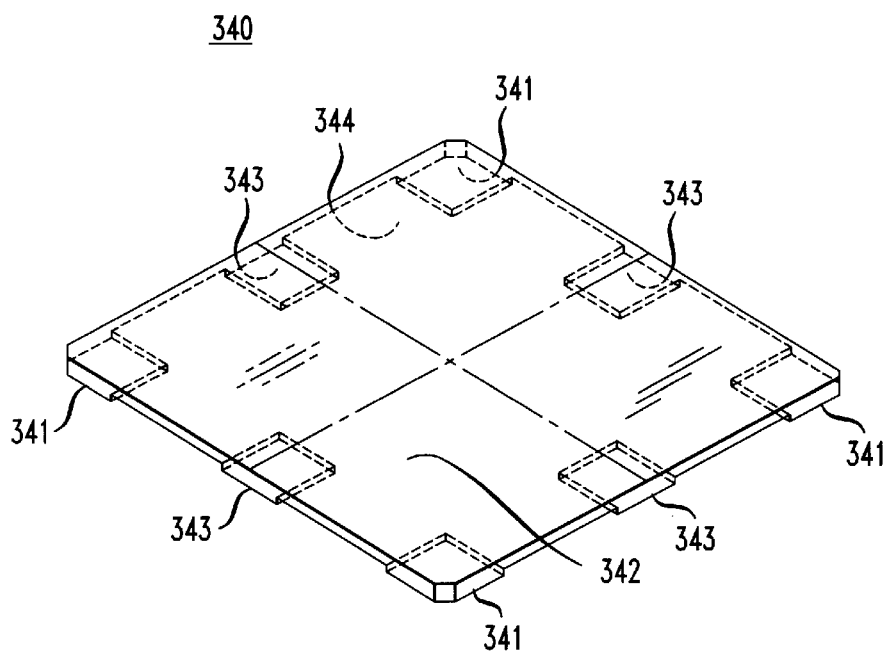
FIG. 5 is an isometric view of a third exemplary heatspreader according to the invention.

FIG. 5 is an isometric view of a third exemplary embodiment of the heatspreader 340. Heatspreader 340 has a substantially flat top surface 342, and the legs may be formed either by milling the bottom surface 344 of the heatspreader plate, or by molding the heatspreader 344. Heatspreader 340 may also be formed from copper. Heatspreader 340 may also be attached by the method described above.

A structure according to the invention lowers thermal resistance by effectively spreading the heat in the assembled structure. A heat spreader according to the invention provides improved thermal performance compared to a similarly sized heat spreader without legs.

The structure described herein physically protects the die or other IC device.

The structure described herein provides a convenient surface on which to attach a heat sink for those assemblies that require additional cooling capability.

This structure can improve the reliability of the silicon/substrate interface. It does so in a way that avoids a hermetic or quasi-hermetic structures by allowing for the free ingress and egress of cleaning fluids and moisture. This reduces cost and avoids reliability problems.

A package and packaging method according to the invention is easily cleaned and drained. The invention eliminates processing concerns related to the development of a pinhole-free package, and further eliminates any problems related to draining fluids which could subsequently enter through pinholes in the sealed packages of the prior art.

Although the exemplary embodiment includes organic substrates, one of ordinary skill in the art can readily apply the heatspreader and heatspreader connecting method described above to ceramic flip chip packages.

Although the invention has been described in terms of exemplary embodiments, it is not limited thereto. Rather, the appended claim should be construed broadly, to include other variants and embodiments of the invention which may be made by those skilled in the art without departing from the scope and range of equivalents of the invention.

What is claimed is:

1. A circuit assembly, comprising:

a substrate having a plurality of terminal pads;

an integrated circuit device having first and second faces, the first face having a plurality of electrical interconnections to the terminal pads in the substrate; and a heatspreader plate having a plurality of legs, the second face of the integrated circuit device connected to the heatspreader plate by a first thermal interface material, each of the plurality of legs connected to the substrate by a second thermal interface material, wherein a shortest distance between any two of the plurality of legs is sufficiently large to allow ingress and egress of liquids and gases.

2. A circuit assembly according to claim 1, wherein the heatspreader is fabricated from a single flat piece of metal.

3. A circuit assembly according to claim 1, wherein the heatspreader is formed of copper.

4. A circuit assembly according to claim 1, wherein the heatspreader has at least four legs.

5. A circuit assembly according to claim 1, wherein each one of the first and second thermal interface materials is selected from the group consisting of an adhesive, thermal grease, solder and a phase change material.

6. A circuit assembly according to claim 1, wherein each one of the first and second thermal interface materials is a conductive adhesive.

7. A circuit assembly according to claim 1, wherein the substrate is an organic substrate.

8. A circuit board assembly, comprising:

an integrated circuit package, comprising:

a first substrate having first and second surfaces, each surface having a plurality of terminal pads, an integrated circuit device having first and second faces, the first face having a plurality of electrical interconnections to the terminal pads in the first surface of the first substrate, and a heatspreader plate having a plurality of legs, the second face of the integrated circuit device connected to the heatspreader plate by a first thermal interface material, each of the plurality of legs connected to the first surface of the first substrate by a second thermal interface material; and a second substrate having a plurality of terminal pads, the terminal pads of the second substrate being connected to the terminal pads of the second surface of the first substrate, wherein a shortest distance between any two of the plurality of legs is sufficiently large to allow ingress and egress of liquids and gases.

9. A circuit board assembly according to claim 8, wherein the heatspreader is fabricated from a single flat piece of metal.

10. A circuit board assembly according to claim 8, wherein the heatspreader is formed of copper.

11. A circuit board assembly according to claim 8, wherein the heatspreader has at least four legs.

12. A heatspreader, said heatspreader having a flat heatspreader plate section, said heatspreader having at least four legs formed integrally from the same piece of material as the heatspreader plate section, each leg being stamped into the heatspreader proximate to a perimeter of the heatspreader, each leg having a bottom surface substantially parallel to the heatspreader plate section.

13. A heatspreader according to claim 12, wherein the heatspreader is made of copper.

14. A heatspreader according to claim 12, wherein the heatspreader plate section is rectangular, and a substantially rectangular leg is formed in each corner of the heatspreader.

15. A heatspreader according to claim 12, wherein:

the heatspreader plate is adapted to be connected to a first side of an integrated circuit device by a first thermal interface material, and each leg is adapted to be connected to a substrate on which the second side of the integrated circuit device is connected by a second thermal interface material.

16. A circuit assembly, comprising:

an integrated circuit device having first and second faces, the first face having a plurality of electrical interconnections connectable to a plurality of terminal pads on a substrate; and a heatspreader plate having a plurality of legs, the second face of the integrated circuit device connected to the heatspreader plate by a first thermal interface material, each of the plurality of legs connectable to the substrate by a second thermal interface material, wherein a shortest distance between any two of the plurality of legs is sufficiently large to allow ingress and egress of liquids and gases when the legs interface with a substrate.

17. A circuit assembly, comprising:

a substrate having a plurality of terminal pads;

an integrated circuit device having first and second faces, the first face having a plurality of electrical interconnections to the terminal pads in the substrate; and a heatspreader plate having at least four legs, the second face of the integrated circuit device connected to the heatspreader plate by a first thermal interface material, each leg connected to the substrate by a second thermal interface materials.

18. A circuit board assembly, comprising:

an integrated circuit package, comprising:

a first substrate having first and second surfaces, each surface having a plurality of terminal pads, an integrated circuit device having first and second faces, the first face having a plurality of electrical interconnections to the terminal pads in the first surface of the first substrate, and a heatspreader plate having at least four legs, the second face of the integrated circuit device connected to the heatspreader plate by a first thermal interface material, each of the plurality of legs connected to the first surface of the first substrate by a second thermal interface material; and a second substrate having a plurality of terminal pads, the terminal pads of the second substrate being connected to the terminal pads of the second surface of the first substrate.

19. A heatspreader, said heatspreader having a flat heatspreader plate section, said heatspreader having a plurality of legs formed integrally from the same piece of material as the heatspreader plate section, each leg being stamped into the heatspreader proximate to a perimeter of the heatspreader, each leg having a bottom surface substantially parallel to the heatspreader plate section, wherein a shortest distance between any two of the plurality of legs is sufficiently large to allow ingress and egress of liquids and gases.

* * * * *